US009484549B2

(12) United States Patent
Jung et al.

(10) Patent No.: US 9,484,549 B2
(45) Date of Patent: Nov. 1, 2016

(54) DISPLAY DEVICE

(71) Applicant: SAMSUNG DISPLAY CO., LTD., Yongin-si, Gyeonggi-do (KR)

(72) Inventors: Hae-Goo Jung, Yongin-si (KR); Do-Hyung Ryu, Yongin-si (KR); Jae-Woo Song, Anyang-si (KR); Jae-Hoon Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/447,436

(22) Filed: Jul. 30, 2014

(65) Prior Publication Data

US 2015/0243676 A1  Aug. 27, 2015

(30) Foreign Application Priority Data

Feb. 24, 2014  (KR) .................. 10-2014-0021396

(51) Int. Cl.
*H01L 27/14* (2006.01)
*H01L 29/18* (2006.01)
*H01L 23/02* (2006.01)
*H01L 23/48* (2006.01)
*H01L 51/52* (2006.01)
*H01L 27/32* (2006.01)

(52) U.S. Cl.
CPC ....... *H01L 51/5243* (2013.01); *H01L 27/3276* (2013.01); *H01L 51/525* (2013.01); *H01L 27/3246* (2013.01)

(58) Field of Classification Search
CPC .............. H01L 23/538; H01L 27/3276; H01L 27/127; H01L 27/124; H01L 51/525; H01L 27/3246
USPC ............. 257/88, 678, E27.119, 72, E33.066; 313/512
See application file for complete search history.

(56) References Cited

U.S. PATENT DOCUMENTS

| 2010/0327737 | A1* | 12/2010 | Hayashi | B60Q 3/0253 313/504 |
| 2012/0025229 | A1* | 2/2012 | Lee | H01L 27/3276 257/91 |
| 2012/0097987 | A1* | 4/2012 | Ryu | H01L 51/524 257/88 |
| 2012/0133278 | A1* | 5/2012 | Ryu | H01L 27/3276 313/512 |
| 2012/0168778 | A1* | 7/2012 | Kim | H01L 27/3279 257/88 |
| 2012/0256203 | A1* | 10/2012 | Kim | H01L 51/5243 257/88 |
| 2013/0020967 | A1* | 1/2013 | Jung | H01L 51/5243 315/312 |

FOREIGN PATENT DOCUMENTS

| KR | 10-2007-0043551 | 4/2007 |
| KR | 10-2011-0035049 | 4/2011 |

(Continued)

*Primary Examiner* — Dzung Tran
(74) *Attorney, Agent, or Firm* — Lewis Roca Rothgerber Christie LLP

(57) ABSTRACT

A display device includes a first substrate including a display area and a non-display area, the display area including a pixel including a first electrode, a light emission layer, and a second electrode; a sealing member facing the first substrate; and a first conducting member in the display area, the first conducting member being coupled to the first electrode, where the sealing member includes: a first conductive layer coupled to the first conducting member; an insulating layer on the first conductive layer; and a second conductive layer on the insulating layer, the second conductive layer being coupled to the second electrode.

12 Claims, 5 Drawing Sheets

(56) References Cited

FOREIGN PATENT DOCUMENTS

| KR | 10-2011-0051783 | 5/2011 |
| KR | 10-2012-0011590 | 2/2012 |
| KR | 10-2012-0076162 | 7/2012 |
| KR | 10-2013-0071543 | 7/2013 |

* cited by examiner

DISPLAY DEVICE

CROSS-REFERENCE TO RELATED APPLICATION

This application claims priority to and the benefit of Korean Patent Application No. 10-2014-0021396, filed on Feb. 24, 2014, in the Korean Intellectual Property Office, the entire content of which is incorporated herein in its entirety by reference.

BACKGROUND

1. Field

Aspects of embodiments of the present invention are directed toward a display device in which driving voltage is applied to first and second electrodes in a display unit using (utilizing) a sealing member.

2. Description of the Related Art

In general, flat panel displays, such as liquid crystal displays and organic light emitting diode displays, include a plurality of pairs of electric field generating electrodes and an electro-optical active layer interposed therebetween. In the case of the liquid crystal display, a liquid crystal layer is included as the electro-optical active layer, and in the case of the organic light emitting diode display, an organic light emitting layer is included as the electro-optical active layer.

One of the pair of electric field generating electrodes is generally connected to a switching element so as to receive an electric signal. The electro-optical active layer converts the electric signal into an optical signal so that an image is displayed.

A display device includes a display area where an image is displayed, and a non-display area outside the display area. The non-display area may be divided into three regions: a sealing region where a sealing member is disposed; a line region where various lines are disposed; and a pad region where pad electrodes extending from the lines are disposed. A chip on film (COF) or flexible printed circuit (FPC) is bonded to the pad region so as to apply drive power to light emitting diodes. The chip on film (COF) and flexible printed circuit (FPC) are connected to a printed circuit board (PCB).

As the area of a flat panel display increases, luminance non-uniformity of the display increases, and, consequently, the pad regions are formed at four edges (top, bottom, left, and right) of a substrate so as to apply drive power to light emitting diodes. However, the above flat panel displays have an intricate structure, and as the number of chip on film (COF), flexible printed circuit (FPC), or printed circuit board (PCB) included in the display increases, manufacturing costs of the display also increase.

Further, since the pad regions are disposed at four edges of a substrate, a dead space (e.g., a width of a non-display area that does not contribute to the displaying of an image) of the substrate becomes larger, and when the printed circuit board (PCB) is arranged parallel to the substrate, the dead space of a product becomes much larger.

SUMMARY

Aspects of embodiments of the present invention are directed toward a display device in which a pad is disposed on a sealing member so as to apply drive power to a display of a panel.

According to an embodiment of the present invention, a display device includes: a first substrate including a display area and a non-display area, the display area including a pixel including a first electrode, a light emission layer, and a second electrode; a sealing member facing the first substrate; and a first conducting member in the display area, the first conducting member being connected to the first electrode, where the sealing member includes: a first conductive layer connected to the first conducting member; an insulating layer on the first conductive layer; and a second conductive layer on the insulating layer, the second conductive layer being connected to the second electrode.

The first conducting member may connect the first conductive layer to the first electrode.

The display device may further include a pixel defining layer configured to define a pixel area, and a spacer on the pixel defining layer.

A portion of the second electrode may be on the spacer.

The display device may further include a pad in the non-display area of the first substrate, the pad being connected to the second conductive layer.

The display device may further include a second conducting member configured to connect the second conductive layer to the pad.

The display device may further include a connecting member on the first substrate, the connecting member being configured to connect the pad to the second electrode.

The sealing member may be on the connecting member.

The pixel defining layer may have a contact hole enabling connection of the first conducting member to the first electrode and the first conductive layer.

The light emission layer may be between the first and second electrodes.

According to embodiments of the present invention, the display device includes a pad area, configured to transmit drive power to first and second electrodes, on a sealing member so that a dead space of a first substrate decreases, and the drive power is directly supplied to a display area through the sealing member so that voltage drop is reduced, the drive power is uniformly (or substantially uniformly) supplied, and luminance uniformity of the display area increases.

Further, as the luminance uniformity increases, an optical correction time is reduced, and thus productivity increases. Also, a line supplying the drive power has a decreased length so that a thickness of the line may be smaller, thereby increasing process efficiency.

The foregoing summary is for illustration only and is not intended to be in any way limiting. In addition to the illustrative aspects, embodiments, and features described above, further aspects, embodiments, and features will become more apparent by reference to the drawings and the following detailed description.

BRIEF DESCRIPTION OF THE DRAWINGS

The above and other features and aspects of embodiments of the present invention will be more clearly understood by reference to the following detailed description when considered together with the accompanying drawings, in which.

DETAILED DESCRIPTION

Figure 1:
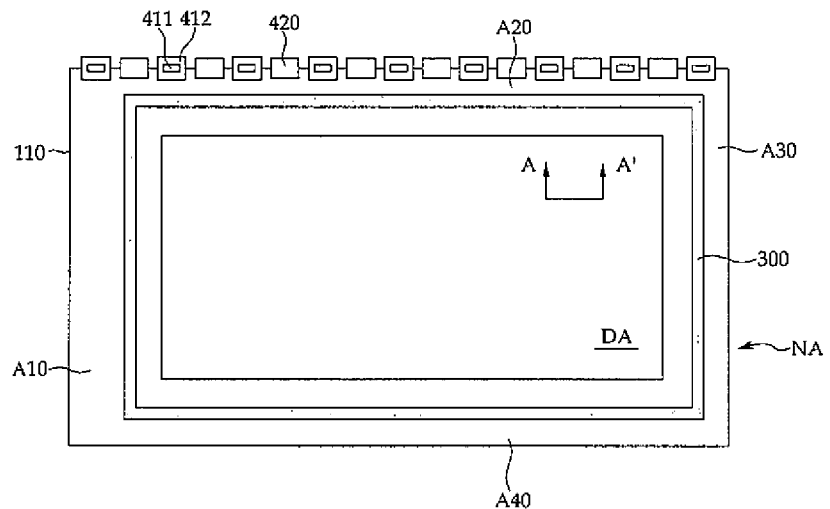
FIG. 1 is a schematic plan view illustrating a configuration of a display device according to a first embodiment of the present invention.

Advantages and features of embodiments of the present invention and methods for achieving them will become more apparent from the embodiments described below with reference to the accompanying drawings. The present invention may, however, be embodied in many different forms and modified in many ways and, therefore, should not be construed as being limited to the embodiments set forth herein. Rather, these embodiments are provided so that this disclosure will be thorough and complete, and will convey the scope of the invention to those skilled in the art. The present invention is only defined by the scope of the claims. Therefore, well-known constituent elements, operations and techniques are not described in detail herein in an effort not to obscure the present invention. Like reference numerals refer to like elements throughout the specification.

The spatially relative terms "below", "beneath", "lower", "above", "upper", and the like, may be used herein for ease of description to describe the relative relationship between one element or component and another element or component as illustrated in the drawings. It will be understood, however, that the spatially relative terms are intended to encompass different orientations of the device in use or operation, in addition to the orientation depicted in the drawings. For example, in the case where a device shown in the drawing is turned over, a device positioned "below" or "beneath" another device may be placed "above" another device. Accordingly, the relative term "below" may include both the lower and upper positions. The device may also be oriented in the other direction, and thus the spatially relative terms may be interpreted differently depending on the orientation or perspective. Also, in the context of the present application, when a first element is referred to as being "on" a second element, it can be directly on the second element or be indirectly on the second element with one or more intervening elements interposed therebetween.

The terminology used herein is for the purpose of describing particular embodiments only and should not be construed as limiting the invention. As used herein, the singular forms "a," "an" and "the" are intended to include the plural forms as well, unless the context clearly indicates otherwise. It will be further understood that the terms "comprises" and/or "comprising," when used in this specification, specify the presence of the described component, step, operation and/or element, but do not exclude the presence or addition of one or more other components, steps, operations and/or elements. Expressions such as "at least one of," when preceding a list of elements, modify the entire list of elements and do not modify the individual elements of the list. Further, the use of "may" when describing embodiments of the present invention refers to "one or more embodiments of the present invention."

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

According to an embodiment of the present invention, a display device may be an organic light emitting display or a liquid crystal display. Hereinafter, the display device will be described as an organic light emitting display device for ease of description, but the display device may also be an organic light emitting display device.

FIG. 1 is a schematic plan view illustrating a configuration of a display device according to a first embodiment of the present invention.

Referring to FIG. 1, an organic light emitting display device according to this embodiment includes a first substrate 110 divided into a display area DA and a non-display area NA. A plurality of pixels are disposed at (e.g., in) the display area DA of the first substrate 110 so as to be capable of displaying images, and one or more driver chips 411 and power transfer units (power supply units) 420 are disposed at (e.g., in) the non-display area NA. However, in some embodiments, the driver chips 411 (or all driver chips 411) and power transfer units 420 are not disposed at (e.g., in) the non-display area NA inside of a sealing layer 300 (e.g., between the sealing layer 300 and the display area DA), and the driver chips 411 and power transfer units 420 may be partly or completely (all) omitted from the non-display area NA. For example, as illustrated in FIG. 1, the driver chip 411 and power transfer unit 420 may be disposed at or in (or only in) a second area A20 of the non-display area NA outside of the sealing layer 300 (e.g., the sealing layer 300 is between display area DA and the driver chips 411 and power transfer units 420).

The sealing layer 300 is disposed in the non-display area NA in order to bond a first substrate 110 and a second substrate to each other. The sealing layer 300 may include a thermosetting resin such as epoxy resin, but the sealing layer 300 is not limited thereto.

In the case of a comparable organic light emitting display device, a non-display area NA is disposed outside of a sealing layer 300, and a second area A20 corresponding to a pad area and first, third, and fourth areas A10, A30, and A40 corresponding to a line area are included. The non-display area NA may include one second area A20 as illustrated in FIG. 1, or the non-display area NA may include two or more second areas A20. For example, at least one of the first, third, and fourth areas A10, A30, and A40 as well as the second area A20 shown in FIG. 1 may correspond to the pad area.

A driver includes a plurality of driver chips 411 and a printed circuit board. The printed circuit board is electrically connected to the first substrate 110 by a tape carrier package 412.

One end portion of the tape carrier package 412 is bonded to the second area A20 of the first substrate 110 so that a plurality of the tape carrier packages 412 have a predetermined (or set) space therebetween, and the other end portion thereof is bonded to the printed circuit board. The one and the other end portions of the tape carrier package 412 may be connected to a driver circuit of the first substrate 110, and the printed circuit board, respectively, using (utilizing) a connecting member such as an anisotropic conductive film (ACF), but the connecting member is not limited thereto. The printed circuit board may supply gate power, data power, first drive power (which is common power), and second drive power (which is cathode power), respectively, to a gate line, a data line, a common power line, and a second electrode through the driver circuit of the first substrate 110 using (utilizing) the tape carrier package 412. The first drive power is supplied to a first electrode 210 (which may act as an anode of an organic light emitting diode 200) illustrated in FIG. 5, and the second drive power is supplied to a second electrode 220 (which may act as a cathode of the organic light emitting diode 200).

As illustrated in the embodiment shown in FIG. 1, a plurality of power transfer units 420 are provided, each of which is connected to the first substrate 110, and the power transfer units 420 are disposed between the adjacent tape carrier packages 412. The power transfer unit 420 receives drive power including the first and second drive powers from the driver, and transmits the drive power to the organic light emitting diode 200 illustrated in FIG. 5 through the driver circuit. For example, the power transfer unit 420 corresponds to the second area A20 of the first substrate 110, and connects the first substrate 110 to the driver. The power transfer unit 420 may be arranged in the form of a power supply film.

In other words, in a comparable organic light emitting display device, the drive power is distributed to be transmitted through the driver chip 411, the tape carrier package 412, and the power transfer unit 420, thereby increasing a dead space of the first substrate 110.

Hereinafter, embodiments of the present invention that reduce a dead space and apply a uniform voltage to pixels of a display unit will be described with reference to the drawings.

First Embodiment of the Present Invention

A display device according to the first embodiment of the present invention will be described below with reference to FIGS. 2 and 3.

Figure 2:
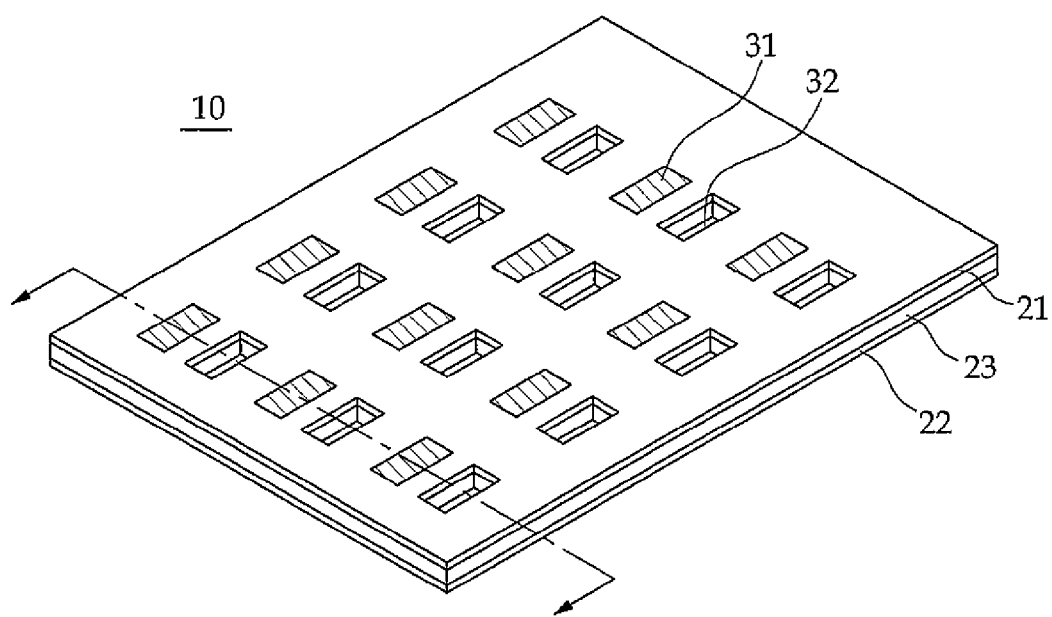
FIG. 2 is a schematic plan view illustrating a sealing member according to the first embodiment of the present invention.

FIG. 2 is a schematic plan view illustrating a sealing member 10 according to the first embodiment of the present invention. FIG. 3 is a cross-sectional view of the sealing member 10 illustrated in FIG. 2, taken along line B-B' of FIG. 2.

Figure 3:
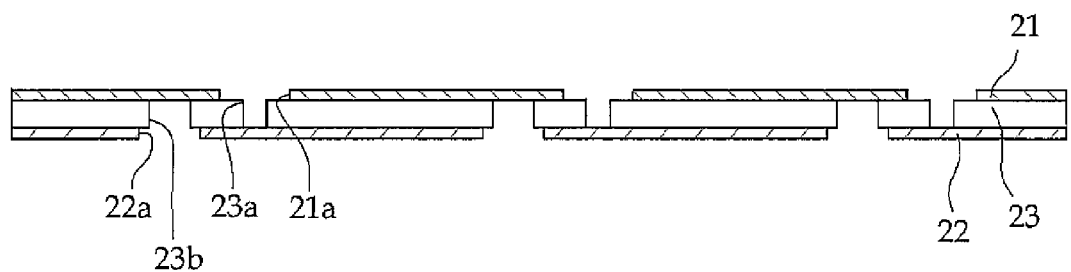
FIG. 3 is a cross-sectional view of the sealing member illustrated in FIG. 2, taken along line B-B' of FIG. 2.

Referring to FIGS. 2 and 3, the sealing member 10 includes a first conductive layer 21, a second conductive layer 22, an insulating layer 23, a first conductive layer contact area 31, and a second conductive layer contact area 32.

The sealing member 10 has a size for covering a display area DA (e.g., all of the display area DA) except for a pad area A10 of a non-display area NA. For example, the sealing member 10 has a size for covering all three line areas A20, A30, and A40. The sealing member 10 covers pixels inside the sealing member 300, and the sealing member 10 covers a driver as a protection so as to prevent (or reduce) infiltration of oxygen or moisture.

The first conductive layer 21 is connected to a first conducting member 41 (shown in FIG. 6), the insulating layer 23 is disposed on the first conductive layer 21, and the second conductive layer 22 is disposed on the insulating layer 23. Further, the second conductive layer 22 is connected to a second electrode 220 (shown in FIG. 6).

The first conductive layer 21 has a plurality of first openings 21a. The second conductive layer 22 is connected to external drive power through the first openings 21a. The number of the first openings 21a may be the same as (or correspond to) that of the second conductive layer contact area 32.

The first conductive layer contact area 31 is a connecting terminal to apply the external drive power, and transmits first drive power (e.g., ELVDD) to the first conductive layer 21. The first conductive layer contact area 31 is a part of one surface exposed outside of the first conductive layer 21 (e.g., one exposed surface of the first conductive layer 21). The first conductive layer 21 may include a metal having high conductivity and moisture blocking effects (aluminum or copper, for example, but the present disclosure is not limited thereto).

The insulating layer 23 is disposed on the first conductive layer 21. The insulating layer 23 has a plurality of second openings 23a and a plurality of third openings 23b.

The second conductive layer 22 is disposed on the insulating layer 23. The second conductive layer 22 includes the second conductive layer contact area 32 on a surface opposite of (e.g., facing away from) the surface of the second conductive layer 22 facing (e.g., directed toward) the first substrate 110.

The second conductive layer contact area 32 is exposed (e.g., exposed outside) through the first opening 21a of the first conductive layer 21 and the second opening 23a of the insulating layer 23. The second conductive layer 22 has a plurality of fourth openings 22a.

The third openings 23b and the fourth openings 22a may be identical (or substantially identical, or correspond) to a first conducting member, which will be described further below, in terms of the number. For example, the third openings 23b and the fourth openings 22a may be formed according to the number of the first conducting member through which the first conductive layer 21 and a first electrode of a pixel are connected to each other.

The second conductive layer contact area 32 is a connecting terminal to apply external drive power, and transmits second drive power (e.g., ELVSS) to the second conductive layer 22. The second conductive layer contact area 32 is a part of one surface of the second conductive layer 22 exposed to a direction opposite to (e.g., facing away from) the first substrate 110. The second conductive layer 22 may include a metal having high conductivity and moisture blocking effects (aluminum or copper, for example, but the present disclosure is not limited thereto).

The first opening 21a and the fourth opening 22a may be formed by a punching process, but the present disclosure is not limited thereto.

A display unit of the first substrate 110 will be described below with reference to FIGS. 4 and 5 before a connection structure by combining the display unit of the first substrate 110 and the sealing member 10 is described.

Figure 4:
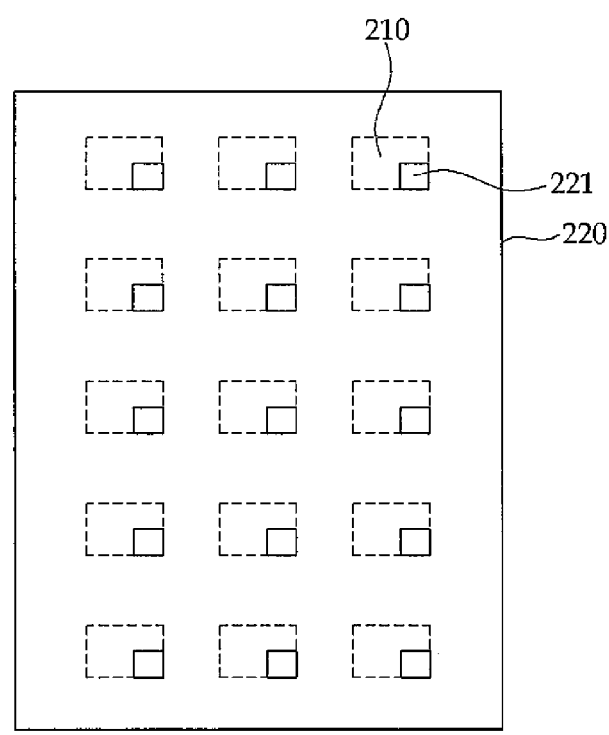
FIG. 4 is a schematic plan view illustrating first and second electrodes.

FIG. 4 is a schematic plan view illustrating first and second electrodes. FIG. 5 is a cross-sectional view of the display device illustrated in FIG. 1, taken along line A-A' of FIG. 1.

Figure 5:
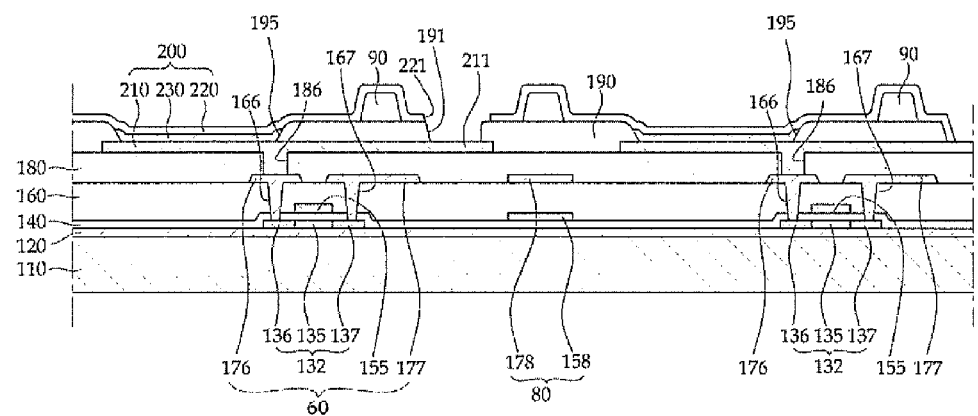
FIG. 5 is a cross-sectional view of the display device illustrated in FIG. 1, taken along line A-A' of FIG. 1.

Referring to FIG. 5, the first substrate 110 is an insulating substrate made of glass, quartz, ceramic, plastic, or the like, but embodiments of the present invention are not limited thereto. The first substrate 110 may be a metal substrate made of stainless steel, etc., but the metal substrate is not limited thereto.

A buffer layer 120 is disposed on the first substrate 110. The buffer layer 120 may prevent (or reduce) infiltration of impurities and planarize a surface of the first substrate, and may be made of many different materials allowing such functions to be performed. For example, the buffer layer 120 may be (or be made of) any one of a silicon nitride (SiNx) layer, a silicon oxide (SiO$_2$) layer, and a silicon oxynitride (SiOxNy) layer, but the present disclosure is not limited thereto. However, the buffer layer 120 is not necessarily disposed on the first substrate 110, and may not be provided (e.g., may be omitted) according to the types and process conditions of the first substrate 110.

A semiconductor layer 132 is disposed on the buffer layer 120. The semiconductor layer 132 may be (or be made of) any one of a polycrystalline silicon layer, an amorphous silicon layer, and oxide semiconductors such as indium gallium zinc oxide (IGZO) and indium zinc tin oxide (IZTO), but the present disclosure is not limited thereto. For example, in the case where the semiconductor layer 132 is made of the polycrystalline silicon layer, the semiconductor layer 132 includes a channel area 135 that is not doped with impurities, and p+ doped drain and source areas 136 and 137 at (e.g., on) respective sides of the channel area 135. In this embodiment, p-type (e.g., p-channel) impurities such as boron B are used (utilized) as dopant ions, and B$_2$H$_6$ is generally used. Herein, such impurities vary depending on the kinds of thin film transistors (TFTs).

According to the first embodiment of the present invention, a p-type metal oxide semiconductor (PMOS)-structured TFT using the p-type impurities is used as a TFT 60, but Embodiments of the Present Invention are not Limited Thereto. An n-Type metal oxide semiconductor (NMOS)-structured or complementary metal oxide semiconductor (CMOS)-structured TFT may also be used as the TFT 60. Further, the TFT 60 may be a polycrystalline TFT, an amorphous TFT including an amorphous silicon layer, or an oxide semiconductor TFT.

A gate insulating layer 140 made of silicon nitride (SiNx) or silicon oxide (SiO$_2$) is disposed on the semiconductor layer 132. The gate insulating layer 140 may include at least one of tetraethyl orthosilicate (TEOS), silicon nitride (SiNx), and silicon oxide (SiO$_2$), but the present disclosure is not limited thereto. For example, the gate insulating layer 140 may have a double layer structure in which a silicon nitride layer having a thickness of about 40 nm and a TEOS layer having a thickness of about 80 nm are sequentially laminated, but the structure of the gate insulating layer 140 is not limited thereto in embodiments of the present invention.

A gate wire including a gate electrode 155 is disposed on the gate insulating layer 140. The gate wire further includes a gate line, a first storage electrode 158, and other wires. The gate electrode 155 is disposed to overlap at least a part of the semiconductor layer 132, and overlap the channel area 135 in one embodiment. The gate electrode 155 may prevent the channel area 135 from being doped with impurities (or reduce the amount or likelihood of doping the channel area 135 with impurities) when the drain and source areas 136 and 137 of the semiconductor layer 132 are doped with the impurities in the process of forming the semiconductor layer 132.

The gate electrode 155 and the first storage electrode 158 may be disposed on the same layer, and may be made of the same (or substantially the same) metal material. In this case, the metal material may include at least one of molybdenum (Mo), chromium (Cr), and tungsten (W), but the present disclosure is not limited thereto. For example, the gate electrode 155 and the first storage electrode 158 may be made of molybdenum (Mo) or molybdenum-base alloys.

An interlayer insulating layer 160 configured to cover the gate electrode 155 is disposed on the gate insulating layer 140. The gate insulating layer 140 and the interlayer insulating layer 160 have in common a source contact hole 167 to expose the source area 137 of the semiconductor layer 132, and a drain contact hole 166 to expose the drain area 136 of the semiconductor layer 132. The interlayer insulating layer 160 may be made of tetraethyl orthosilicate (TEOS), silicon nitride (SiNx), or silicon oxide (SiOx) like the gate insulating layer 140, but embodiments of the present invention are not limited thereto.

A data wire including a source electrode 177 and a drain electrode 176 is disposed on the interlayer insulating layer 160. The data wire further includes a data line, a common power line, a second storage electrode 178, and other wires. The source electrode 177 and the drain electrode 176 are respectively connected to the source area 137 and the drain area 136 of the semiconductor layer 132 through the respective contact holes 166 and 167.

The TFT 60 (including the semiconductor layer 132, the gate electrode 155, the source electrode 177, and the drain electrode 176) is formed as described above. A capacitor 80 (including the first storage electrode 158 and the second storage electrode 178) is also formed. In this way, the interlayer insulating layer 160 is a dielectric material of the capacitor 80.

The configuration of the TFT 60 is not limited to the above-described embodiment, and may vary according to configurations generally used in the art.

A planarization layer 180 configured to cover the data wire is disposed on the interlayer insulating layer 160. The planarization layer 180 serves to eliminate (or reduce) steps (or defects or discontinuities) and planarize an organic light emitting diode (OLED) 200 in order to increase light emission efficiency of the OLED 200 that will be disposed on the planarization layer 180. The planarization layer 180 has a first electrode contact hole 186 to expose a part of the drain electrode 176.

The planarization layer 180 may be made of at least one of a polyacrylate resin, an epoxy resin, a phenolic resin, a polyamide resin, a polyimide resin, an unsaturated polyester resin, a polyphenylenether resin, a polyphenylenesulfide resin, and benzocyclobutene (BCB), but the present disclosure is not limited thereto.

A first electrode 210 of the OLED 200 is disposed on the planarization layer 180. Herein, the first electrode 210 acts as an anode. The first electrode 210 is connected to the drain electrode 176 through the contact hole 186 of the planarization layer 180.

A pixel defining layer (PDL) 190 is disposed on the first electrode 210 and defines a pixel area. The PDL 190 has a light emission area 195 to expose the first electrode 210 on the planarization layer 180, and a contact hole 191 to expose a first electrode protrusion 211. For example, the first electrode 210 is disposed to correspond to the light emission area 195 of the PDL 190, and the first electrode protrusion 211 is exposed (e.g., exposed outside) through the contact hole 191 between the PDLs 190. The first electrode protrusion 211 and the contact hole 191 are uniformly (or substantially uniformly) distributed throughout the display area DA.

The PDL 190 may be made of polyacrylate resin or a polyimide resin, but the present disclosure is not limited thereto.

A plurality of spacers 90 having a predetermined (or set) height are disposed on the PDL 190. The plurality of spacers 90 may not be provided (e.g., may be omitted) in consideration of a structure of a display device.

An organic light emitting layer 230 is disposed on the first electrode 210 in the light emission area 195 of the PDL 190, and the second electrode 220 is disposed on the PDL 190 and the organic light emitting layer 230. Herein, the second electrode 220 may be a cathode. The second electrode 220 may be disposed on the spacer 90.

The OLED 200 (including the first electrode 210, the organic light emitting layer 230, and the second electrode 220) is formed as described above.

Any one of the first electrode 210 and the second electrode 220 may be, include or be made of a transparent conductive material, and the other may be, include, or be made of a transflective or reflective conductive material. According to the kinds of materials included in the first electrode 210 and the second electrode 220, an organic light emitting display device may be classified into three types: a top-emission type (kind), a bottom-emission type (kind), and a dual-emission type (kind).

The transparent conductive material may include Indium Tin Oxide (ITO), Indium Zinc Oxide (IZO), zinc oxide (ZnO), or indium oxide (In2O3), but the present disclosure is not limited thereto. The reflective material may include lithium (Li), Calcium (Ca), lithium fluoride/Calcium (LiF/Ca), lithium fluoride/aluminum (LiF/Al), aluminum (Al), silver (Ag), magnesium (Mg), or gold (Au), but the present disclosure is not limited thereto.

The organic light emitting layer 230 may include a low molecular weight organic material or a high molecular weight organic material.

The OLED 200 may further include a hole injection layer (HIL), a hole transporting layer (HTL), a light emission layer, an electron transporting layer (ETL), and/or an electron injection layer (EIL), as well as the organic light emitting layer 230, between the first and second electrodes 210 and 220. For example, the OLED 200 may have a structure in which the hole injection layer (HIL) is disposed on the first electrode 210, and the hole transporting layer (HTL), the organic light emitting layer, the electron transporting layer (ETL), and the electron injection layer (EIL) are sequentially laminated on the hole injection layer (HIL).

Meanwhile, in the case of a liquid crystal display (LCD), the first electrode 210 may be physically and electrically connected to the drain electrode 176 through the contact hole 186, and may receive data voltage from the drain electrode 176. An electric field is generated by the first electrode 210 receiving the data voltage in conjunction with the second electrode (common electrode) of another display substrate receiving common voltage, thereby determining a direction of liquid crystal molecules of a liquid crystal layer between the two electrodes. The first electrode 210 and the second electrode form a capacitor (hereinafter referred to as a "liquid crystal capacitor") so as to maintain the applied voltage after the TFT is turned off.

FIG. 4 illustrates fifteen (15) pixels disposed in the display area DA. The first electrode 210 is included in each pixel. The second electrode 220 has a through hole 221 in a part of an area where the second electrode 220 overlaps the first electrode 210. The through hole 221 allows the first conductive layer 21 and the first electrode 210 to be connected to each other.

Hereinafter, in the case where the sealing member 10 is coupled to the first substrate 110, a structure in which drive power is supplied to the first and second electrodes 210 and 220 will be described with reference to FIG. 6.

Figure 6:
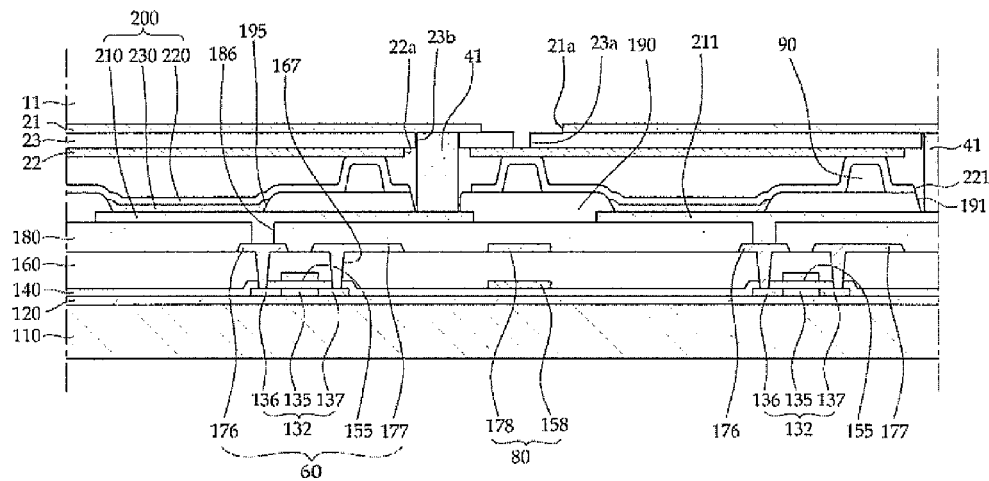
FIG. 6 is a cross-sectional view illustrating the display device of FIG. 5 provided with a sealing member.

FIG. 6 is a cross-sectional view illustrating the display device of FIG. 5 coupled to a sealing member.

Referring to FIG. 6, the first conducting member 41 is disposed in the contact hole 191 of the PDL 190, the through hole 221 of the second electrode 220, the fourth opening 22a of the second conductive layer 22, and the third opening 23b of the insulating layer 23.

External first drive power is supplied to the first electrode 210 through the first conductive layer 21 and the first conducting member 41. The fourth opening 22a of the second conductive layer 22 has an area to the extent that (or such that) an electrical short circuit does not occur (or is not likely to occur) between the first conducting member 41 and the second conductive layer 22. For example, the first conducting member 41 and the second conductive layer 22 are spaced apart from each other by a predetermined (or set) distance. The first conducting member 41 is made of a conductive sealing material.

External second drive power is supplied to the second electrode 220 through the second conductive layer 22. When the first substrate 110 is bonded to the sealing member 10 of FIGS. 2 and 6 under pressing conditions, the second electrode 220 is attached to the second conductive layer 22, thereby electrically connecting (or coupling) the second electrode 220 to the second conductive layer 22.

Thus, the first and second conductive layer contact areas 31 and 32 applying the external drive power are formed on the sealing member 10 at a position corresponding to the display area DA, and thus voltage drop is reduced. Here, a comparable display device supplies power from the outside of a display area of the other display device. On the other hand, according to an embodiment of the present invention, the drive power is directly applied to each pixel in the display area DA so that the voltage drop of the drive power decreases and the drive power is uniformly supplied to each pixel. Further, a pad in the non-display area NA outside the display area DA is not needed to be installed (e.g., is omitted) so that a dead space decreases and the display area DA has a larger area. The drive power is uniformly (or substantially uniformly) applied to each pixel in the display area DA, thereby increasing luminance uniformity of an entire image.

Second Embodiment of the Present Invention

Hereinafter, a second embodiment of the present invention will be described with reference to FIG. 7. According to the second embodiment of the present invention, first drive power is applied to a first electrode in the same (or substantially the same) manner as the first embodiment of the present invention discussed above, and second drive power is applied to a second electrode through a pad in a non-display area NA outside of a display area DA. Below is a description of elements that are different from those of the first embodiment. Elements that are the same (or substantially the same) as those described above with respect to the first embodiment are not described again here.

Figure 7:
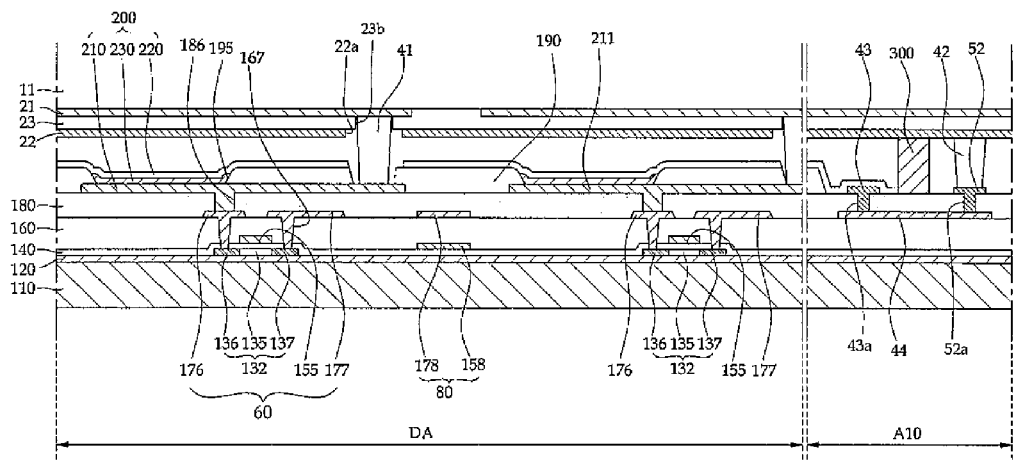
FIG. 7 is a cross-sectional view partially illustrating a display device according to a second embodiment of the present invention.

FIG. 7 is a cross-sectional view illustrating portions of a display device according to the second embodiment of the present invention.

Referring to FIG. 7, a third pad 52 is disposed in a pad area A10 of the non-display area NA. According to the second embodiment of the present invention, the display device further includes a connecting member on a first substrate 110, and the connecting member is configured to connect the third pad 52 to the second electrode 220. The connecting member includes first and second connection units 43 and 44.

In more detail, an end portion of the second electrode 220 is connected to the first connection unit 43 in the pad area A10. The first connection unit 43 is connected to the second connection unit 44 through a first planarization layer opening 43a of a planarization layer 180. The second connection unit 44 is connected to the third pad 52 through a second planarization layer opening 52a of the planarization layer 180. The third pad 52 is connected to a second conductive layer 22 through a second conducting member 42. A second conductive layer contact area 32 is not disposed on (e.g., is omitted from) a second substrate 11 because the second drive power is supplied to the second electrode 220 through the third pad 52.

Meanwhile, the third pad 52 may be connected to the power transfer unit 420 of FIG. 1. For example, the drive power transmitted by the power transfer unit 420 may be applied to the third pad 52. The second drive power is applied to the second electrode 220 from a second area A20, and only the first drive power is directly applied to the first electrode 210 below (or above) the second substrate 11. This is because the first drive power may otherwise experience an increased voltage drop as compared to the second drive power.

Third and Fourth Embodiments of the Present Invention

Hereinafter, third and fourth embodiments of the present invention will be described with reference to FIGS. 8 and 9. Below is a description of configurations of first and second electrodes 210 and 220 that are different from those of the first embodiment of the present invention discussed above. Elements that are the same (or substantially the same) as those described above with respect to the first embodiment are not described again here.

Figure 8:
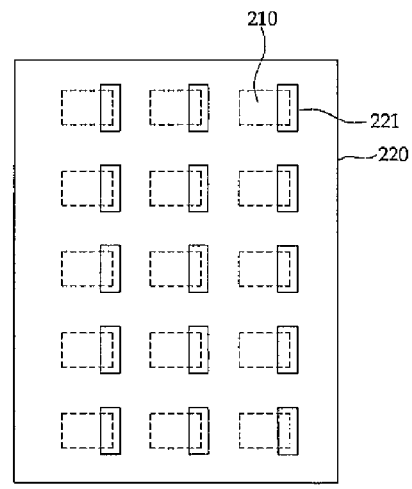
FIG. 8 is a schematic plan view illustrating first and second electrodes according to a third embodiment of the present invention.

FIG. 8 is a schematic plan view illustrating first and second electrodes according to the third embodiment of the present invention. FIG. 9 is a schematic plan view illustrating first and second electrodes according to the fourth embodiment of the present invention.

Referring to FIG. 8, the second electrode 220 may have a larger through hole 221 than that of the first embodiment of the present invention. Therefore, a first conducting member 41 may also be larger, and the first electrode 210 may be supplied with more uniform first drive power.

Figure 9:
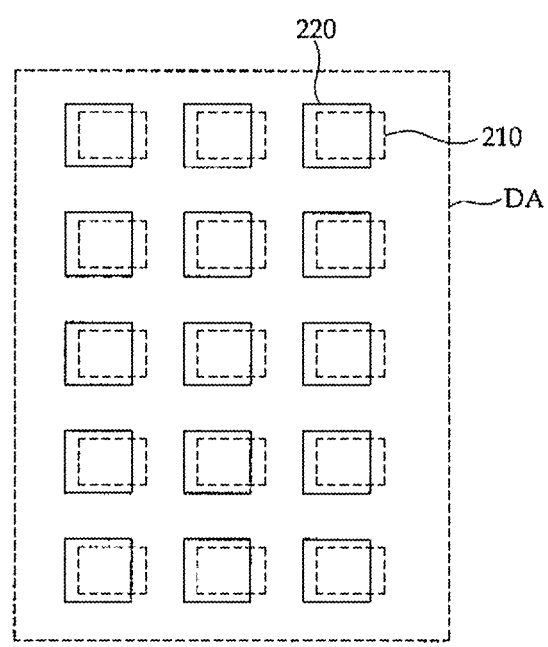
FIG. 9 is a schematic plan view illustrating first and second electrodes according to a fourth embodiment of the present invention.

Referring to FIG. 9, the second electrode 220 is patterned. For example, there is a small area where the second electrode 220 does not overlap the first electrode 210 so that the first electrode 210 is in contact with the first conducting member 41. In addition, the first and second electrodes 210 and 220 may be patterned in various suitable manners to apply the drive power directly to each pixel in a display area DA of a second substrate 11.

From the foregoing, it will be appreciated that certain embodiments of the present disclosure have been described herein for purposes of illustration, and that various modifications may be made without departing from the scope and spirit of the present disclosure. Accordingly, the embodiments disclosed herein are not intended to be limiting, but, on the contrary, the present invention is intended to cover various modifications and equivalent arrangements included within the scope and spirit of the appended claims, and equivalents thereof.

What is claimed is:

1. A display device comprising:
a first substrate comprising a display area and a non-display area, the display area comprising pixels each comprising a first electrode, a second electrode, and a light emission layer disposed between the first electrode and the second electrode;
a sealing member facing the first substrate; and
a first conducting member between the pixels, the first conducting member being coupled to the first electrode, wherein the sealing member comprises:
a first conductive layer coupled to the first conducting member;
an insulating layer below the first conductive layer; and
a second conductive layer below the insulating layer, the second conductive layer being coupled to the second electrode, and
wherein the first conducting member directly contacts the first electrode.

2. The display device of claim 1, wherein the first conducting member is configured to couple the first conductive layer to the first electrode.

3. The display device of claim 1, further comprising a pixel defining layer configured to define a pixel area, and a spacer on the pixel defining layer.

4. The display device of claim 3, wherein the spacer is coated with the second electrode.

5. The display device of claim 1, further comprising a pad in the non-display area of the first substrate, the pad being coupled to the second conductive layer.

6. The display device of claim 5, further comprising a second conducting member configured to couple the second conductive layer to the pad.

7. The display device of claim 6, further comprising a connecting member on the first substrate, the connecting member being configured to couple the pad to the second electrode.

8. The display device of claim 7, wherein the sealing member is on the connecting member.

9. The display device of claim 3, wherein the pixel defining layer has a contact hole enabling connection of the first conducting member to the first electrode and the first conductive layer.

10. The display device of claim 1, wherein the light emission layer is between the first and second electrodes.

11. The display device of claim 3, wherein a portion of the second electrode is on the spacer.

12. A display device comprising:
a first substrate comprising a display area and a non-display area, the display area comprising pixels each comprising a first electrode, a light emission layer, and a second electrode;
a sealing member facing the first substrate; and
a first conducting member between the pixels, the first conducting member being coupled to the first electrode, wherein the sealing member comprises:
a first conductive layer coupled to the first conducting member;
an insulating layer below the first conductive layer; and
a second conductive layer below the insulating layer, the second conductive layer being coupled to the second electrode, and
wherein the first conducting member passes through the second conductive layer in a plane such that the first conducting member is surrounded by the second conductive layer on all sides in the plane.

\* \* \* \* \*